US008321818B2

(12) United States Patent
Agarwal et al.

(10) Patent No.: US 8,321,818 B2
(45) Date of Patent: Nov. 27, 2012

(54) MODEL-BASED RETARGETING OF LAYOUT PATTERNS FOR SUB-WAVELENGTH PHOTOLITHOGRAPHY

(75) Inventors: Kanak B. Agarwal, Austin, TX (US); Shayak Banerjee, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 12/492,301

(22) Filed: Jun. 26, 2009

(65) Prior Publication Data

US 2010/0333049 A1 Dec. 30, 2010

(51) Int. Cl.
*G06F 17/50* (2006.01)

(52) U.S. Cl. ............... 716/53; 716/51; 716/52; 716/54; 716/55

(58) Field of Classification Search .............. 716/50, 716/52, 53, 55, 132
See application file for complete search history.

(56) References Cited

U.S. PATENT DOCUMENTS

| | | |
|---|---|---|
| 6,578,190 B2 | 6/2003 | Ferguson et al. |
| 6,961,916 B2 | 11/2005 | Sarrafzadeh et al. |
| 6,961,920 B2 | 11/2005 | Zach |
| 6,978,438 B1 | 12/2005 | Capodieci |
| 7,237,221 B2 | 6/2007 | Granik et al. |
| 7,318,214 B1* | 1/2008 | Prasad et al. ............ 716/53 |
| 7,325,224 B2 | 1/2008 | Seltmann et al. |
| 7,355,673 B2 | 4/2008 | Hsu et al. |
| 7,396,621 B2 | 7/2008 | Fujisawa et al. |
| 7,434,199 B2 | 10/2008 | Cobb et al. |
| 7,451,068 B2 | 11/2008 | Melvin, III |
| 7,694,267 B1 | 4/2010 | Ye et al. |
| 7,784,019 B1 | 8/2010 | Zach |
| 7,865,864 B2 | 1/2011 | Banerjee et al. |
| 8,146,026 B2 | 3/2012 | Agarwal et al. |
| 8,230,372 B2 | 7/2012 | Agarwal |
| 2005/0026310 A1 | 2/2005 | Zhao et al. |
| 2005/0196682 A1* | 9/2005 | Hsu et al. ............ 430/5 |
| 2006/0024850 A1 | 2/2006 | Monahan et al. |
| 2006/0026541 A1* | 2/2006 | Melvin et al. ............ 716/4 |

(Continued)

OTHER PUBLICATIONS

Agarwal, Kanak B. et al., "Simultaneous Photolithographic Mask and Target Optimization", U.S. Appl. No. 12/619,742, filed Nov. 17, 2009.

(Continued)

*Primary Examiner* — Jack Chaing
*Assistant Examiner* — Mohammed Alam
(74) *Attorney, Agent, or Firm* — Francis Lammes; Stephen J. Walder, Jr.; Eustus D. Nelson (57) ABSTRACT

Mechanism are provided for model-based retargeting of photolithographic layouts. An optical proximity correction is performed on a set of target patterns for a predetermined number of iterations until a counter value exceeds a maximum predetermined number of iterations in order to produce a set of optical proximity correction mask shapes. A set of lithographic contours is generated for each of the set of optical proximity correction mask shapes in response to the counter value exceeding the maximum predetermined number of iterations. A normalized image log slope (NILS) extraction is performed on the set of target shapes and use the set of lithographic contours to produce NILS values. The set of target patterns is modified based on the NILS values in response to the NILS values failing to be within a predetermined limit. The steps are repeated until the NILS values are within the predetermined limit.

20 Claims, 7 Drawing Sheets

U.S. PATENT DOCUMENTS

| | | | |
|---|---|---|---|
| 2006/0277521 A1* | 12/2006 | Chen et al. | 716/21 |
| 2007/0209030 A1 | 9/2007 | Tabery et al. | |
| 2007/0266362 A1 | 11/2007 | Lai et al. | |
| 2008/0022255 A1 | 1/2008 | Zach | |
| 2008/0046846 A1 | 2/2008 | Chew et al. | |
| 2008/0193859 A1 | 8/2008 | Hamouda | |
| 2008/0248412 A1 | 10/2008 | Stuber et al. | |
| 2008/0263483 A1 | 10/2008 | Koike et al. | |
| 2009/0030636 A1 | 1/2009 | Pan et al. | |
| 2009/0144691 A1 | 6/2009 | Rathsack et al. | |
| 2009/0148783 A1 | 6/2009 | Socha | |
| 2009/0199151 A1 | 8/2009 | Banerjee et al. | |
| 2010/0115486 A1* | 5/2010 | Barnes et al. | 716/11 |
| 2010/0122231 A1 | 5/2010 | Agarwal et al. | |
| 2010/0180251 A1 | 7/2010 | Ye et al. | |
| 2010/0269079 A1 | 10/2010 | Banerjee et al. | |
| 2010/0333049 A1* | 12/2010 | Agarwal et al. | 716/55 |
| 2011/0119642 A1* | 5/2011 | Agarwal et al. | 716/50 |
| 2011/0124193 A1 | 5/2011 | Cheng et al. | |
| 2011/0138342 A1 | 6/2011 | Agarwal | |
| 2011/0145770 A1 | 6/2011 | Brooks et al. | |
| 2011/0150343 A1 | 6/2011 | Agarwal et al. | |
| 2011/0271238 A1 | 11/2011 | Mansfield et al. | |

OTHER PUBLICATIONS

Cao, Ke et al., "Standard Cell Characterization Considering Lithography Induced Variations", Design Automation Conference, 2006 43rd ACM/IEEE, pp. 801-804.
Heloue, Khaled R. et al., "Early Analysis and Budgeting of Margins and Corners Using Two-Sided Analytical Yield Models", Computer-Aided Design of Integrated Circuits and Systems, IEEE Transactions on vol. 27, Issue 10, Oct. 2008, pp. 1826-1839.
Hsiao, Chia-Chi et al., "On Distinguishing Process Corners for Yield Enhancement in Memory Compiler Generated SRAM", Memory Technology, Design, and Testing, 2009. MTDT 2009. IEEE International Workshop on; Aug. 31, 2009-Sep. 2, 2009, pp. 83-87.
Kawashima, Shinichi et al., "Implementation Requirements for Edge Exclusion Area Reduction for Maximized Output of Chips from a 200mm Wafer", Semiconductor Manufacturing, 2000, Proceedings of ISSM 2000. The Ninth International Symposium on; Sep. 26-28, 2000, pp. 98-101. 2000 , 98-101.
Wong, K et al., "Development of new methodology and technique to accelerate region yield improvement", Advanced Semiconductor Manufacturing Conference and Workshop, 1998. 1998 IEEE/SEMI; Sep. 23-25, 1998, pp. 82-85.
Yu, Peng et al., "Process Variation Aware OPC with Variational Lithography Modeling", Design Automation Conference, 2006 43rd ACM/IEEE, pp. 785-790.
U.S. Appl. No. 12/024,188.
U.S. Appl. No. 12/619,742.
U.S. Appl. No. 12/630,216.
U.S. Appl. No. 12/645,627.
U.S. Appl. No. 12/770,791.
Banerjee, S et al., "Compensating non-optical effects using electrically driven optical proximity correction", Proceedings of the SPIE—The International Society for Optical Engineering, vol. 7275, 2009, Design for Manufacturability through Design-Process Integration III Conference, Feb. 26-27, 2009, Abstract only, 1 page.
Koike, K et al., "OPC to reduce variability of transistor properties", Proceedings of the SPIE—The International Society for Optical Engineering, vol. 6521, Design for Manufacturability through Design-Process Integration Conference, 28, Feb. 2007, Abstract only, 1 page.
Teh, Siew-Hong et al., "Device Performance-based OPC for Optimal Circuit Performance and Mask Cost Reduction", Proceedings of SPIE, vol. 6925, 692511, 2008, 8 pages.
Notice of Allowance mailed Mar. 19, 2012 for U.S. Appl. No. 12/630,216; 12 pages.
Office Action mailed May 10, 2012 for U.S. Appl. No. 12/645,627; 12 pages.
Notice of Allowance mailed Dec. 1, 2011 for U.S. Appl. No. 12/619,742; 16 pages.
Response to Office Action filed with the USPTO on Jan. 6, 2012 for U.S. Appl. No. 12/630,216; 14 pages.
Bruce, James A. et al., "Model-Based Verification for First Time Right Manufacturing", Proceedings of SPIE, vol. 5756, 2005, pp. 198-207.
Cobb, Nick et al., "Fast Sparse Aerial Image Calculation for OPC", Proceedings of SPIE, vol. 2621, 1995, pp. 534-545.
Cobb, Nick, "Flexible sparse and dense OPC algorithms", Proceedings of SPIE, vol. 5853, 2005, pp. 693-702.
Cobb, Nick et al., "Mathematical and CAD Framework for Proximity Correction", Proceedings of SPIE, vol. 2726, Jun. 1996, pp. 208-222.
Cobb, Nick et al., "Model-based OPC using the MEEF matrix", Proceedings of SPIE, vol. 4889, 2002, pp. 1281-1292.
Cobb, Nick et al., "Using OPC to optimize for image slope and improve process window", Proceedings of SPIE, vol. 5130, 2003, pp. 838-846.
Kobayashi, Sachiko et al., "Automated hot-spot fixing system applied for metal layers of 65-nm logic devices", J. Micro/Nanolith, MEMS MOEMS, vol. 6(3), Jul.-Sep. 2007, 6 pages.
Krasnoperova, Azalia et al., "Process Window OPC for Reduced Process Variability and Enhanced Yield", Proceedings of SPIE, vol. 6154, 2006, 12 pages.
Liebmann, Lars W. et al., "Optimizing Style Options for Sub-Resolution Assist Features", Proceedings of SPIE, vol. 4346, 2001, pp. 141-152.
Liebmann, Lars et al., "Reducing DfM to Practice: the Lithography Manufacturability Assessor", Proceedings of SPIE, vol. 6156, 2006, 12 pages.
Liu, Yong et al., "Optimal binary image design for optical lithography", Proceedings of SPIE, vol. 1264, 1990. pp. 401-412.
Mansfield, Scott et al., "Through-process modeling for design-for-manufacturability applications", J. Micro/Nanolith, MEMS MOEMS, vol. 6(3), Jul.-Sep. 2007, 9 pages.
Torres, J. A, et al., "Integrated Circuit DFM Framework for Deep Sub-Wavelength Processes", Proceedings of SPIE, Vol, 5756, 2005, pp. 39-50.
Yang, Ellyn et al., "Model-Based Retarget for 45nm Node and Beyond", Proceedings of SPIE, vol. 7274, 2009, 8 pages.
Notice of Allowance rnailed Aug. 3, 2012 for U.S. Appl. No. 12/645,627, 8 pages.
Response to Office Action filed Jul. 27, 2012, U.S. Appl. No. 12/645,627, 17 pages.
USPTO U.S. Appl. No. 13/526,984, 2 pages.

* cited by examiner

MODEL-BASED RETARGETING OF LAYOUT PATTERNS FOR SUB-WAVELENGTH PHOTOLITHOGRAPHY

BACKGROUND

The present application relates generally to an improved data processing apparatus and method and more specifically to an apparatus and method for model-based retargeting of photolithographic layouts.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture, and $k_1$ is the factor describing the complexity of resolution enhancement techniques. As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to further increase NA to even higher values. Thus it is commonly recognized that $k_1$ remains a cost effective knob to achieve finer resolution.

Due to the unavoidable diffraction, the optical lithography system is lossy in the sense that only low frequency components of the electromagnetic field can pass the optical system. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep). Large computer farms have to spend weeks of central processing unit (CPU) time to perform data prep after a design is completed. However, all these RET methods have one significant drawback: there is no guarantee the achieved results will be optimal. Furthermore, as the technology is further pushed, manufacturing variations (e.g., dose and focus variations during the lithograph steps) have to be considered. However, it is quite challenging to systematically incorporate the process variations into the traditional RETs.

The goal of process variation aware RET is to maximize process window. Process window is defined as the range of exposure dose and defocus values for which the printed image is within a required tolerance. Process variation aware RET methods such as process window OPC (PW-OPC) distort mask patterns to maintain image fidelity at multiple dose and focus corners. However in the low $k_1$ regime, the mask optimization techniques by themselves are not sufficient to obtain acceptable common process window for all possible layout patterns that are permitted by the technology ground rules.

SUMMARY

In one illustrative embodiment, a method, in a data processing system, is provided for model-based retargeting of photolithographic layouts. The illustrative embodiment performs an optical proximity correction on a set of target patterns for a predetermined number of iterations until a counter value exceeds a maximum predetermined number of iterations in order to produce a set of optical proximity correction mask shapes. Responsive to the counter value exceeding the maximum predetermined number of iterations, the illustrative embodiment generates a set of lithographic contours for each of the set of optical proximity correction mask shapes. The illustrative embodiment performs a normalized image log slope (NILS) extraction on the set of target shapes and uses the set of lithographic contours to produce NILS values. Responsive to the NILS values failing to be within a predetermined limit, the illustrative embodiment modifies the set of target patterns based on the NILS values. The illustrative embodiment repeats the previous steps until the NILS values are within the predetermined limit.

In other illustrative embodiments, a computer program product comprising a computer usable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Common lithographic processing of a layout may be improved by local perturbation of target patterns in some instances. The perturbation of the target layout is known as retargeting. Retargeting modifies the target layout shapes as opposed to optical proximity correction (OPC) which optimizes mask shapes for a given target. The illustrative embodiments provide a mechanism for model-based retargeting of photolithographic layouts. The model-based retargeting mechanism modifies the shape provided by the designer in order to generate new target shapes that provide for improved printability. The retargeting provided by the model-based retargeting mechanism substantially eliminates optical rule checking (ORC) errors that are currently unfixable by well-known resolution enhancement techniques (RETs), such as optical proximity correction (OPC). The retargeting provided by the model-based retargeting mechanism eases the burden on design rules by converting ground rule clean but non-manufacturable design shapes into manufacturable target shapes.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In addition, the program code may be embodied on a computer readable storage medium on the server or the remote computer and downloaded over a network to a computer readable storage medium of the remote computer or the users' computer for storage and/or execution. Moreover, any of the computing systems or data processing systems may store the program code in a computer readable storage medium after having downloaded the program code over a network from a remote computing system or data processing system.

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 1:
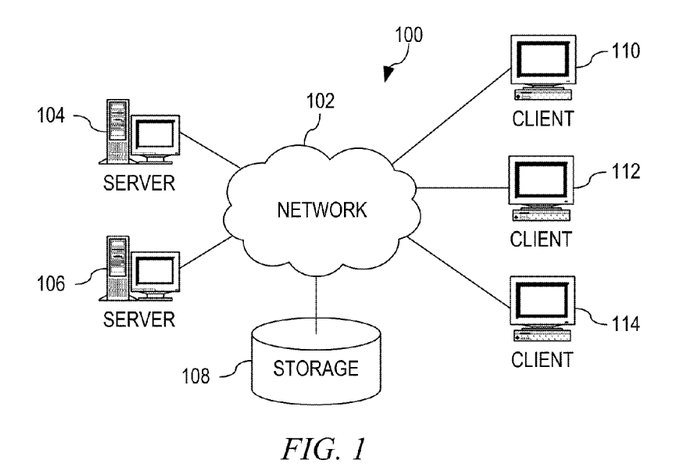
FIG. 1 depicts a pictorial representation of an example distributed data processing system in which aspects of the illustrative embodiments may be implemented.
Figure 2:
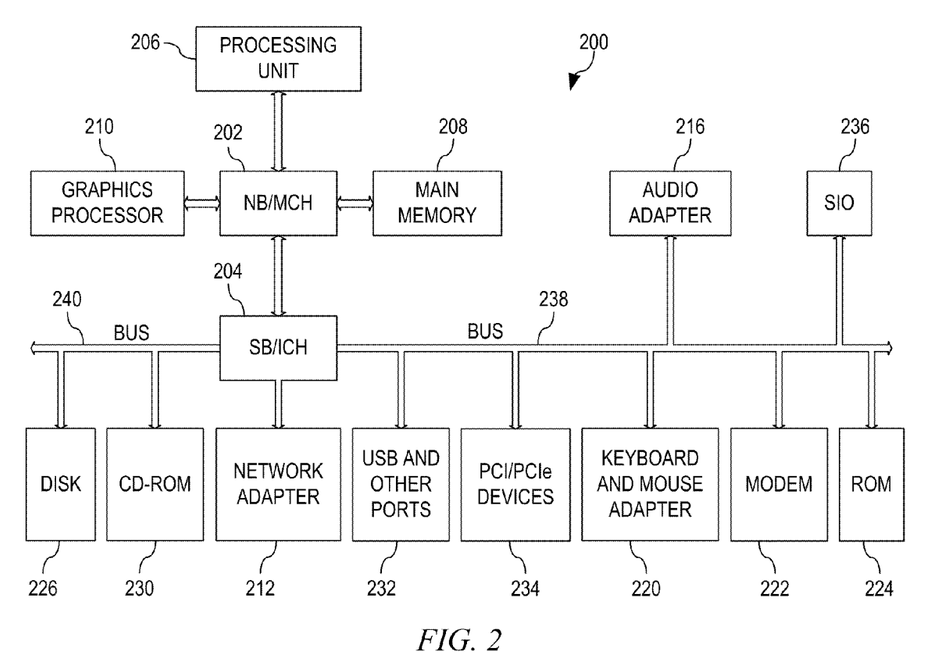
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. While the description following FIGS. 1 and 2 will focus primarily on a single data processing device implementation of a gradient-based search mechanism for optimizing photolithograph masks, this is only an example and is not intended to state or imply any limitation with regard to the features of the present invention. To the contrary, the illustrative embodiments are intended to include distributed data processing environments and embodiments in which photolithograph masks may be optimized using a gradient-based search mechanism.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
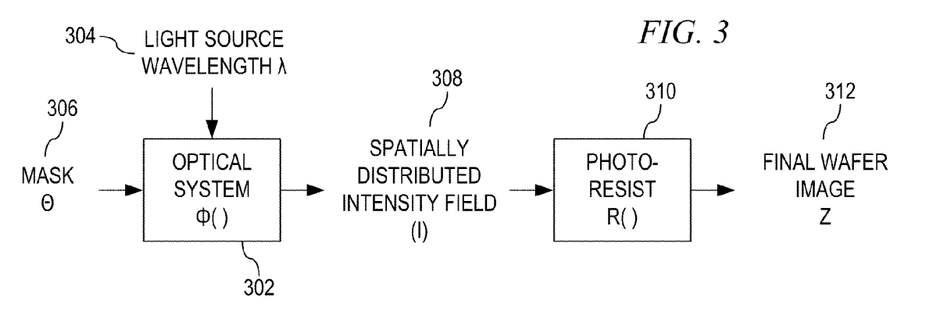
FIG. 3 illustrates a highly simplified schematic view of a state-of-the-art optical lithography process.

FIG. 3 illustrates a highly simplified schematic view of a state-of-the-art optical lithography process. In optical system ($\Phi(\ )$) 302, light source 304 of wavelength λ projects through received mask (Θ) 306 to achieve a spatially distributed intensity field (I) 308 on the wafer source. After chemical reactions of photo-resist (R($\ $)) 310 on the wafer source, final wafer image (Z) 312 forms on the wafer source.

The currently known retargeting methods are rule-based. The rule-based methods apply a certain set of retargeting rules to the target shapes before passing the modified shapes to the OPC tool. The retargeting rules may be developed through extensive image simulations on an initial set of representative layout constructs. The rules developed from these experiments may also be applied to retarget any generic layout. The issues with rule-based retargeting are analogous to issues with rule-based OPC. Some problems with rule-based retargeting include: the practical impossibilities to enumerate exponential number of 2-D layout configurations for retargeting rule development, the possibility of a layout hot-spot escape in some cases that are fixable by retargeting but not covered by retargeting rules, the inability to express certain complex 2-D layout patterns and corresponding retargeting operations by rules, the context dependence where some layout constructs require different amounts of retargeting in different instances, and the need to constantly update current retargeting rules with changes in the models or the resolution enhancement technique (RET) recipe.

Figure 4:
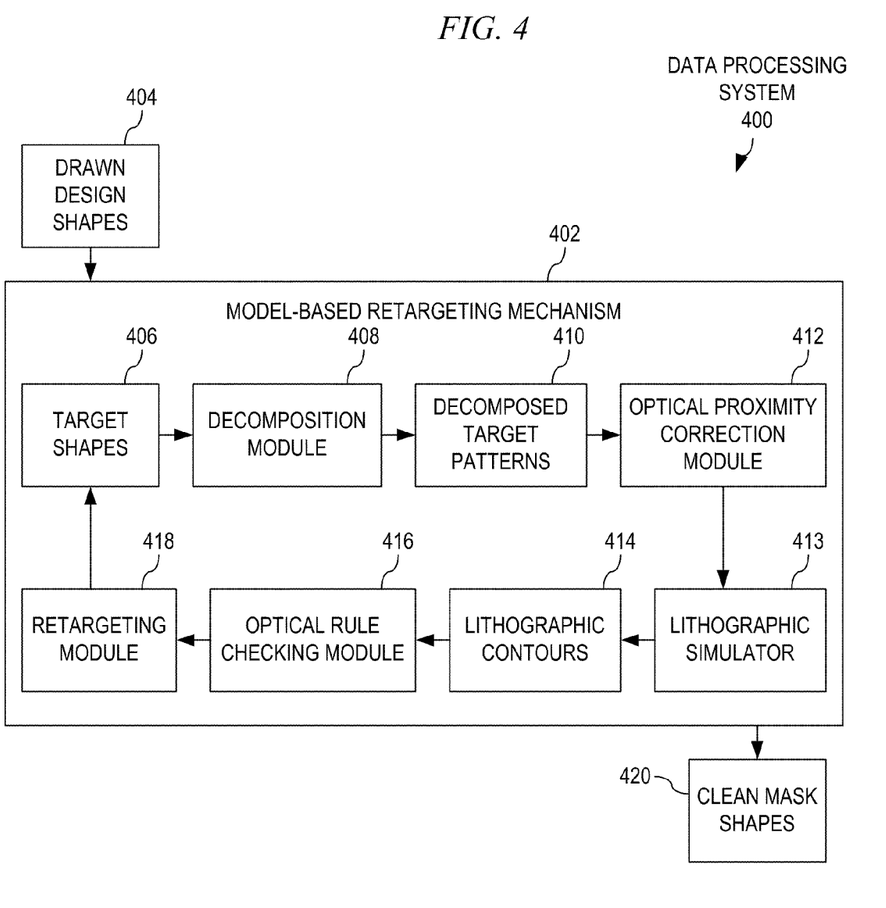
FIG. 4 depicts a block diagram of a model-based retargeting mechanism for photolithographic layouts in accordance with an illustrative embodiment.

FIG. 4 depicts a block diagram of a model-based retargeting mechanism for photolithographic layouts in accordance with an illustrative embodiment. Here, model-based means that the retargeting is performed based on optical and resist models and not based on rules. Model-based retargeting mechanism 402 in data processing system 400 initially receives drawn design shape 404 from a designer. Model-based retargeting mechanism 402 uses drawn design shapes 404 as initial target shapes 406. Model-based retargeting mechanism 402 then performs a decomposition of target shapes 406 using decomposition module 408. Decomposition module 408 is required when multiple exposures are used to print the target shapes on the wafer. Decomposition module 408 is not needed where single exposure is used. After decomposition module 408 decomposes target shapes 406 into decomposed target patterns 410, then optical proximity correction module 412 performs optical proximity correction on decomposed target patterns 410 to compensate for image errors due to diffraction, process effects, or the like and creates two separate masks for the different exposures. Lithographic simulator 413 then performs simulations on post OPC mask shapes to check for image fidelity across a range of dose and focus values and produces lithographic contours 414.

Model-based retargeting mechanism 402 then uses optical rule checking module 416 to perform an optical rule check on lithographic contours 414. Optical rule check may involve checking for violations such as pinching/bridging errors, minimum width/spacing errors, minimum overlap errors, or the like. If optical rule checking module 416 determines that there are errors in lithographic contours 414, then model-based retargeting mechanism 402 uses retargeting module 418 to modify target shapes 406 based on the errors identified by optical rule checking module 416. Retargeting module 418 may modify target shapes 406 by using shape addition, subtraction, width/space biasing, or the like. Retargeting operations modify target shapes while maintaining the desired electrical connectivity. Once retargeting module 418 modifies target shapes 406, then model-based retargeting mechanism 402 starts the process over again with decomposing the modified target shapes 406. Once optical rule checking module 416 determines that there are no errors in lithographic contours 414, then model-based retargeting mechanism 402 produces clean mask shapes 420.

Thus, retargeting module 418 modifies target shapes 406 provided by the designer to generate new target shapes that have better printability. The retargeting provided by retargeting module 418 is different from traditional mask optimization performed only by optical proximity correction which changes the mask not the target layout. Therefore, retargeting may eliminate optical rule checking errors that are not fixable by optical proximity correction.

Figure 5:
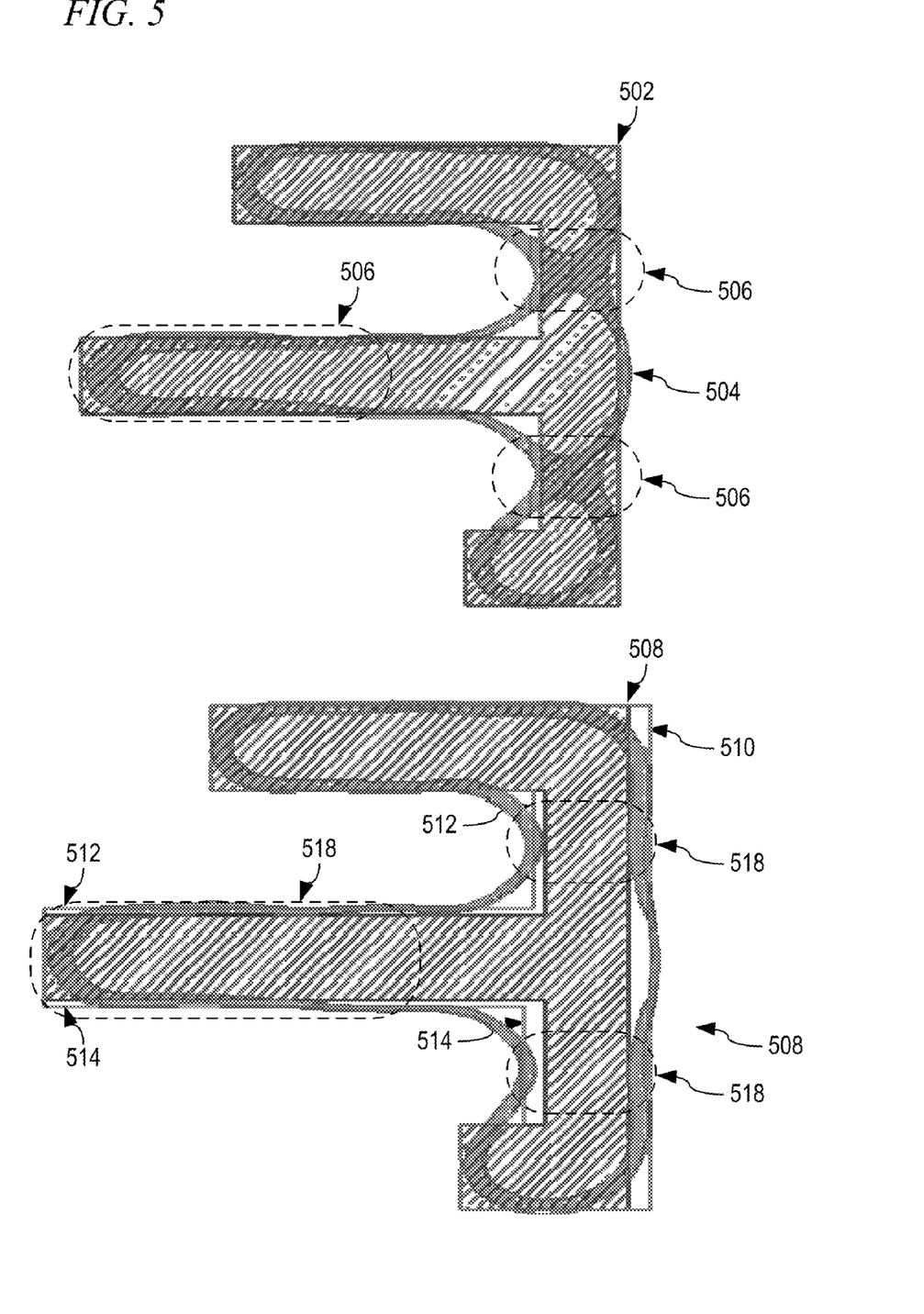
FIG. 5 depicts an example of retargeting performed by a model-based retargeting mechanism in accordance with an illustrative embodiment.

FIG. 5 depicts an example of retargeting performed by a model-based retargeting mechanism in accordance with an illustrative embodiment. In retargeting, the model-based retargeting mechanism starts with target shape 502. After decomposition and optical proximity correction, optical rule checking of process variability bands (PV-bands) produced by lithographic contours 504 indicates errors that comprise area of pinching 506. The retargeting performed by the retargeting module then biases target shape 508 by adding shapes 510, 512, and 514 to areas 518 where pinching was previously identified that will compensate for the errors identified during optical rule checking.

In another illustrative embodiment a retargeting mechanism is provided for optimizing target shapes using normalized image log slope (NILS). NILS is a measure of image robustness and is directly proportional to exposure latitude. Exposure latitude represents the percentage change in exposure for which printed linewidth does not violate the required tolerance specifications. NILS is expressed as:

$$w \frac{\partial \ln I(x)}{\partial x}$$

where I(x) represents the spatial aerial image intensity and w is the feature width. Higher NILS indicates that the features are more robust to lithographic variation while lower NILS indicates increased susceptibility of the shapes to lithographic process variability.

Figure 6:
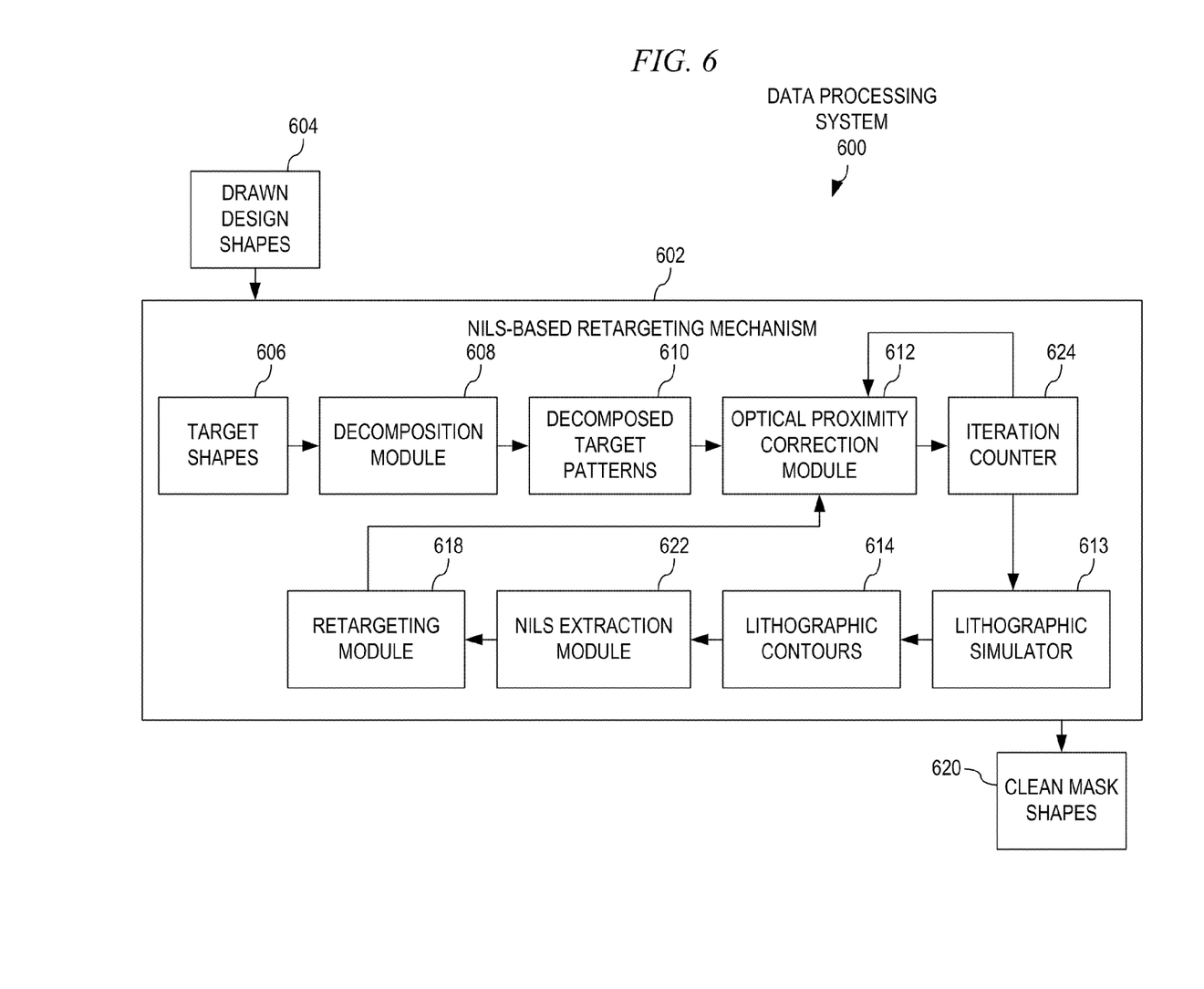
FIG. 6 depicts a block diagram of a model-based retargeting mechanism for photolithographic layouts that implements normalized image log slope (NILS) in accordance with an illustrative embodiment.

FIG. 6 depicts a block diagram of a normalized image log slope (NILS)-based retargeting mechanism for photolithographic layouts that uses normalized image log slope in accordance with an illustrative embodiment. NILS-based retargeting mechanism 602 in data processing system 600 initially receives drawn design shape 604 from a designer. NILS-based retargeting mechanism 602 uses drawn design shapes 604 as initial target shapes 606. NILS-based retargeting mechanism 602 then performs a decomposition of the target shapes 606 for multiple exposure lithography using decomposition module 608. Decomposition module 608 is not needed when single exposure is used. After decomposition module 608 decomposes target shapes 606 into decomposed target patterns 610, then optical proximity correction module 612 performs a small number of initial optical proximity correction iterations on decomposed target patterns 610. The initial OPC iterations may be zero meaning that the initial OPC iterations may be skipped altogether. Instead of retargeting after all optical proximity corrections are complete as described in FIG. 4, NILS-based retargeting integrates retargeting with OPC iterations based on NILS measurements. NILS-based retargeting mechanism 602 provides for optical proximity correction module 612 to perform optical proximity correction up to a maximum predetermined number of iterations. Therefore, each time optical proximity correction module 612 performs an optical proximity correction, iteration counter 624 within NILS-based retargeting mechanism 602 increments. Once the value of iteration counter 624 exceeds the maximum predetermined number of iterations, lithographic simulator 613 performs simulations on post OPC mask shapes and produces lithographic contours 614. NILS extraction module 622 then performs a NILS extraction from one or more lithographic contours 614. NILS extraction may be performed after each OPC iteration in which case the maximum predetermined number of OPC iterations is set to one. Alternatively, NILS extraction may be performed after every few OPC iterations. The maximum number of OPC iterations between two successive NILS extractions may also be dynamically controlled.

For each target edge fragment and corresponding one or more lithographic contours 614, NILS extraction module 622 computes two types of NILS; NILS for width (WNILS) and NILS for space (SNILS). NILS extraction module 622 identifies all the target edges with low NILS. Low WNILS are indicative of potential pinching or minimum width areas and low SNILS are indicative of potential bridging or minimum spacing areas. NILS extraction module 622 uses a heuristics-based approach for target resizing. If NILS extraction module 622 identifies a target edge fragment with low WNILS, then NILS extraction module 622 moves the target edge fragment out by a predetermined specified amount. If NILS extraction module 622 identifies a target edge fragment with low SNILS, then NILS extraction module 622 moves the target edge fragment in by a predetermined specified amount. If NILS extraction module 622 identifies a target edge fragment with both low WNILS and low SNILS, then NILS extraction module 622 performs no movement of the target edge fragment.

Retargeting module 618 modifies the target shapes based on NILS values from NILS extraction module 622. That is, retargeting module 618 biases target edge fragments similar to the operation performed by optical proximity correction 612 on mask edge fragments. Once retargeting module 618 has performed retargeting, retargeting module 618 sends the new target patterns to optical proximity correction module 612 for a next set of OPC iterations. When NILS extraction module 622 determines that NILS is within a predetermined limit or NILS may not be improved any further by retargeting, then the retargeting process stops and NILS-based retargeting mechanism 602 performs final OPC iterations and produces clean mask shapes 620.

Thus, retargeting module 618 in association with NILS extraction module 622 modifies target shapes 606 provided by the designer to generate new target shapes that have better printability. Retargeting using NILS extraction may eliminate optical rule checking errors that are not fixable by optical proximity correction. Retargeting using NILS is very cost-effective as opposed to retargeting described in FIG. 4 because, in NILS based retargeting, it is not required to run full OPC and process window optical rule checking for each retargeting iteration. NILS-based retargeting may be embedded within OPC iterations. Retargeting may be performed by extracting NILS from aerial image simulations used by the OPC module resulting in small run-time overhead.

Figure 7A:
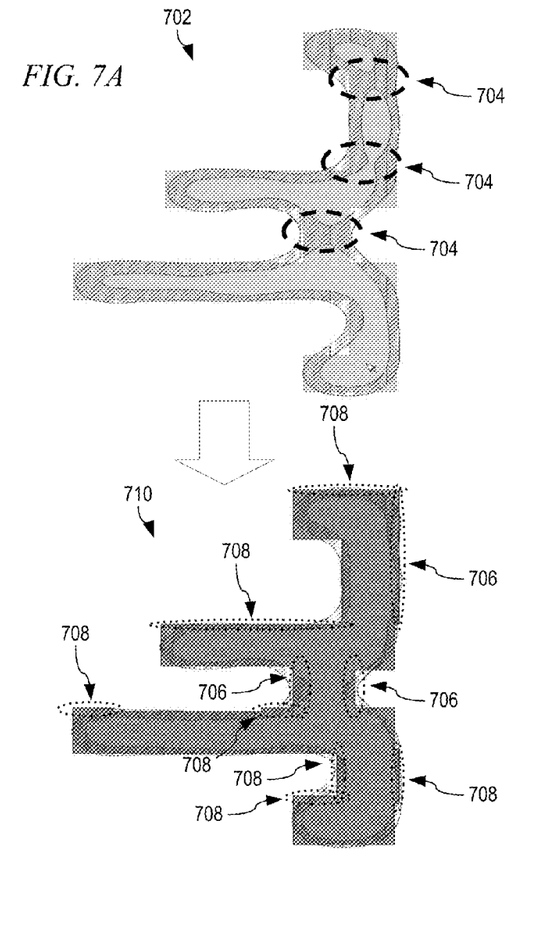
FIGS. 7A and 7B depict an example of retargeting performed by a model-based retargeting mechanism using NILS extraction in accordance with an illustrative embodiment.
Figure 7B:
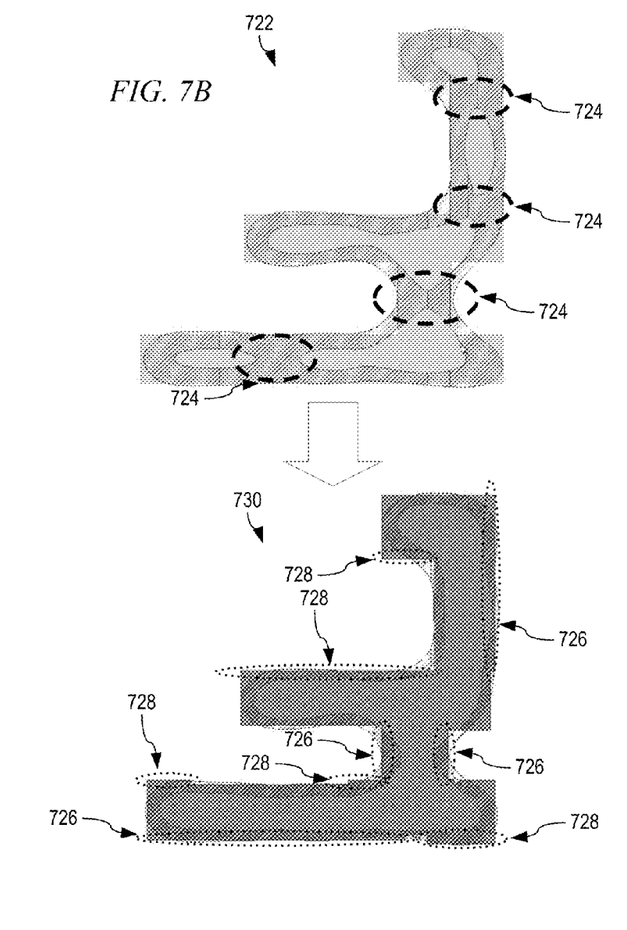

FIGS. 7A and 7B depict an example of retargeting performed by a model-based retargeting mechanism using NILS extraction in accordance with an illustrative embodiment. After decomposition and optical proximity correction of an initial target shape, process variability bands (PV-bands) produced by aerial image contours across dose and focus corners of target shapes 702 and 722 indicate errors that comprise areas of pinching 704 and 724. These results show that in the absence of retargeting, the image fidelity is not-maintained across process window. NILS-based retargeting adds shapes 706, 708, 726, and 728 to target shapes 710 and 730 that result in better PV-bands and no pinching errors.

Figure 8:
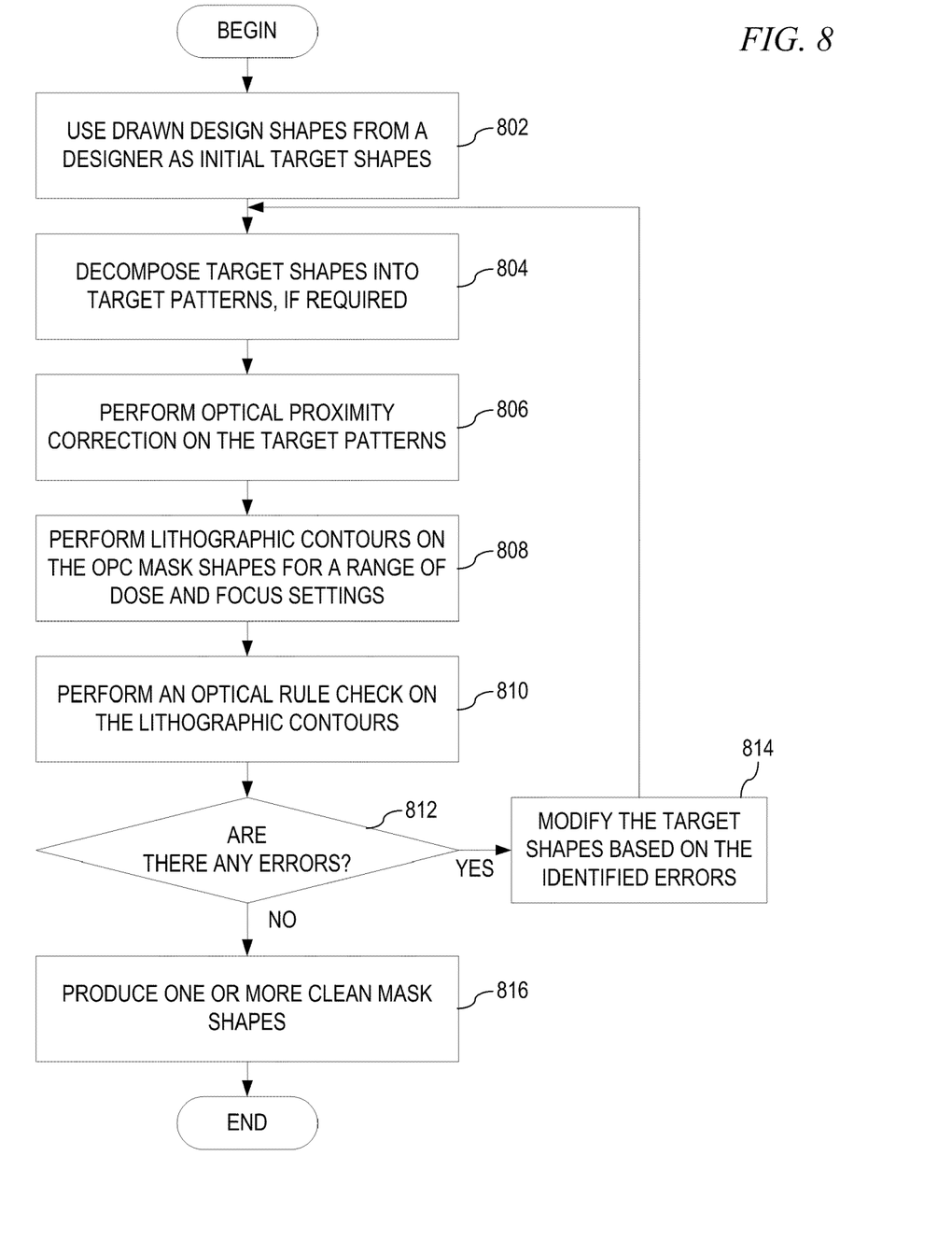
FIG. 8 depicts an exemplary flow diagram of the operation performed by a model-based retargeting mechanism in accordance with an illustrative embodiment.

FIG. 8 depicts an exemplary flow diagram of the operation performed by a model-based retargeting mechanism in accordance with an illustrative embodiment. As the operation begins, the model-based retargeting mechanism uses drawn design shapes from a designer as initial target shapes (step 802). An optional decomposition module performs a decomposition of the target shapes to separate the target shapes into target patterns for different exposures, if required (step 804). The decomposition module is required when multiple exposures are used to print the target shapes on the wafer but not when single exposure is used. After decomposition, an optical proximity correction module performs optical proximity correction on the target patterns to produce OPC mask shapes (step 806). A lithographic simulator then performs simulations on the OPC mask shapes for a range of dose and focus settings to produce lithographic contours (step 808).

An optical rule checking module within the model-based retargeting mechanism then performs an optical rule check on the lithographic contours (step 810). The model-based retargeting mechanism determines if the optical rule checking module has identified any errors (step 812). If at step 812 the optical rule checking module identifies errors in the lithographic simulations, then a retargeting module within the model-based retargeting mechanism modifies the target shapes based on the errors identified by optical rule checking module thereby producing modified target shapes (step 814). The retargeting module may modify the target shapes using shape addition, subtraction, width/space biasing, or the like. Retargeting operations modify target shapes while maintaining the desired electrical connectivity. Once the retargeting module modifies the target shapes, then the operation returns to step 804. If at step 812 the optical rule checking module determines that there are no errors in the lithographic simulations, then the model-based retargeting mechanism produces one or more clean mask shapes (step 816), with the operation ending thereafter.

Figure 9:
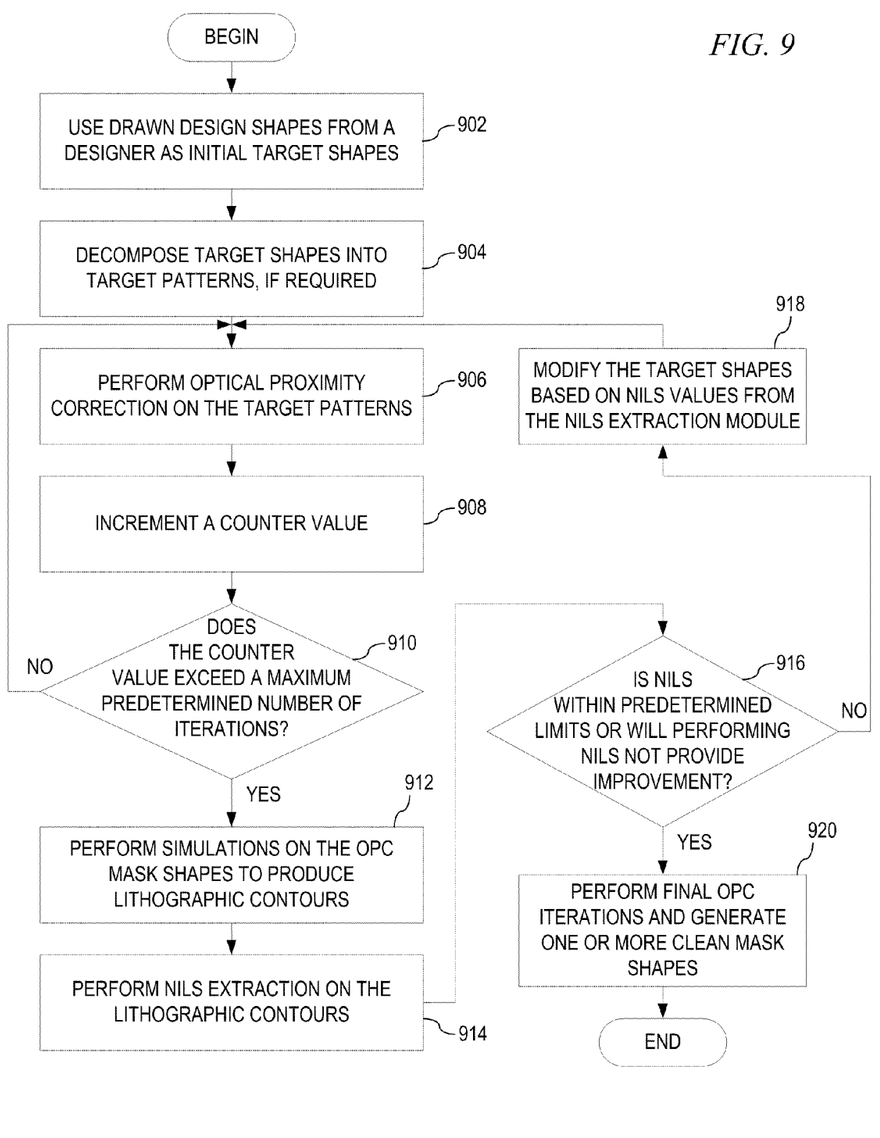
FIG. 9 depicts an exemplary flow diagram of the operation performed by a model-based retargeting mechanism using normalized image log slope (NILS) in accordance with an illustrative embodiment.

FIG. 9 depicts an exemplary flow diagram of the operation performed by a model-based retargeting mechanism using normalized image log slope (NILS) in accordance with an illustrative embodiment. As the operation begins, the model-based retargeting mechanism uses drawn design shapes from a designer as initial target shapes (step 902). An optional decomposition module within the model-based retargeting mechanism performs a decomposition of the target shapes into target patterns for different exposures, if required (step 904). The decomposition module is required when multiple exposures are used to print the target shapes on the wafer but not when single exposure is used. After decomposition, an optical proximity correction module in the model-based retargeting mechanism performs a small number of optical proximity correction iterations on the target patterns to produce OPC mask shapes (step 906).

Each time the optical proximity correction module performs an optical proximity correction iteration, an iteration counter increments a counter value (step 908). The model-based retargeting mechanism determines if the counter value of the iteration counter has exceeded a maximum predetermined number of iterations (step 910). If at step 910 the counter value of the iteration counter has failed to exceed the maximum predetermined number of iterations, then the operation returns to step 906. If at step 910 the counter value of the iteration counter has exceeded a maximum predetermined number of iterations, a lithographic simulator then performs simulations on the OPC mask shapes to produce lithographic contours (step 912).

For each target fragments a NILS extraction module performs a NILS extraction on the lithographic contours (step 914). At step 916, the NILS extraction module determines that the NILS is within a predetermined limit or NILS may not be improved any further by retargeting. If at step 916 the NILS extraction module determines that the NILS is not with-in a predetermined limit or NILS may improve by retargeting, then a retargeting module modifies the target shapes based on NILS values from the NILS extraction module (step 918) with the operation returning to step 906 thereafter. If at step 916 the NILS extraction module determines that the NILS is within a predetermined limit or NILS may not be improved any further by retargeting, then retargeting process stops and the model-based retargeting mechanism performs final OPC iterations and generates one or more clean mask shapes (step 920), with the operation ending thereafter.

Thus, the illustrative embodiments provide mechanisms for model-based retargeting of photolithographic layouts. The model-based retargeting mechanism modifies the shapes provided by the designer in order to generate new target shapes that provide for improved printability. The retargeting provided by the model-based retargeting mechanism substantially eliminates optical rule checking (ORC) errors that are currently unfixable by well-known resolution enhancement techniques (RETs), such as optical proximity correction (OPC). The retargeting provided by the model-based retargeting mechanism eases the burden on design rules by converting clean but non-manufacturable design shapes into manufacturable target shapes.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for model-based retargeting of photolithographic layouts, the method comprising:

performing, by a processor in the data processing system, optical proximity correction on a set of target patterns provided by a designer in order to produce a set of optical proximity correction mask shapes;

generating, by the processor, a set of lithographic contours for each of the set of optical proximity correction mask shapes;

performing, by the processor, an optical rule check on each of the set of lithographic contours to compare the set of lithographic contours to the set of target patterns;

responsive to identifying errors in the set of lithographic contours during the optical rule check, modifying, by the processor, at least one target shape in the set of target patterns provided by the designer based on the errors in order to produce a set of modified target shapes;

performing, by the processor, the optical proximity correction on the set of modified target shapes in order to produce a set of modified optical proximity correction mask shapes;

generating, by the processor, a set of modified lithographic contours for each of the set of modified optical proximity correction mask shapes;

performing, by the processor, the optical rule check on each of the set of modified lithographic contours to compare the set of modified lithographic contours to the set of target patterns; and repeating, by the processor, the modifying the at least one target shape in the set of target patterns provided by the designer based on the errors, performing optical proximity correction on the set of modified target patterns, generating of the set of modified lithographic contours; and performing of the optical rule check on each of the set of modified lithographic contours steps until the optical rule check fails to identify any errors.

2. The method of claim 1, further comprising:

responsive to a failure to identify any errors in the set of lithographic simulations during the optical rule check, generating, by the processor, a set of clean mask shapes.

3. The method of claim 1, wherein modifying the at least one target shape based on the errors comprises modifying the at least one target shape by performing at least one of addition, subtraction or width/space biasing to avoid lithographic violations while maintaining a desired electrical connectivity.

4. A method, in a data processing system, for NILS-based retargeting of photolithographic layouts, the method comprising:

performing, by a processor in the data processing system, an optical proximity correction on a set of target patterns provided by a designer for a predetermined number of iterations until a counter value exceeds a maximum predetermined number of iterations in order to produce a set of optical proximity correction mask shapes;

responsive to the counter value exceeding the maximum predetermined number of iterations, generating, by the processor, a set of lithographic contours for each of the set of optical proximity correction mask shapes;

performing, by the processor, a normalized image log slope (NILS) extraction on the set of target shapes and use the set of lithographic contours to produce NILS values;

responsive to the NILS values failing to be within a predetermined limit, modifying, by the processor, at least one target shape in the set of target patterns provided by the designer based on the NILS values in order to produce a set of modified target shapes;

performing, by the processor, the optical proximity correction on the set of modified target shapes for the predetermined number of iterations until the counter value exceeds the maximum predetermined number of iterations in order to produce a set of modified optical proximity correction mask shapes;

responsive to the counter value exceeding the maximums determined number of iterations, generating, by the processor, a set of modified lithographic contours for each of the set of modified optical proximity correction mask shapes;

performing, by the processor, the normalized image log slope (NILS) extraction on the set of modified target shapes and use the set of modified lithographic contours to produce the NILS values; and repeating, by the processor, the modifying the at least one target shape in the set of target patterns provided by the designer based on the NILS values in order to produce the set of modified target shapes, performing the optical proximity correction on the set of modified target shapes, generating the set of modified lithographic contours for each of the set of modified optical proximity correction mask shapes, and performing the normalized image log slope (NILS) extraction on the set of modified target shapes and use the set of modified lithographic contours to produce the NILS values steps until the NILS values are within the predetermined limit.

5. The method of claim 4, further comprising:

responsive to the NILS values being within the predetermined limit, generating, by the processor, a set of clean mask shapes.

6. The method of claim 4, wherein modifying the at least one target shape based on the NILS values avoids lithographic violations while maintaining a desired electrical connectivity.

7. The method of claim 4, wherein the NILS extraction is performed on target edge fragments from the set of lithographic contours.

8. The method of claim 7, wherein the NILS extraction computes at least one of a NILS for width (WNILS) or a NILS for space (SNILS).

9. The method of claim 8, wherein low WNILS are indicative of potential pinching areas and wherein low SNILS are indicative of potential bridging areas.

10. The method of claim 9, further comprising:

responsive to performing the NILS extraction on target edge fragments from the set of lithographic contours resulting in identifying a target edge fragment with low WNILS, moving, by the processor, the target edge fragment out by a predetermined specified amount.

11. The method of claim 9, further comprising:

responsive to performing the NILS extraction on target edge fragments from the set of lithographic contours resulting in identifying a target edge fragment with low SNILS, moving, by the processor, the target edge fragment in by a predetermined specified amount.

12. The method of claim 9, further comprising:

responsive to performing the NILS extraction on target edge fragments from the set of one or more lithographic contours resulting in identifying a target edge fragment with low WNILS and low SNILS, performing, by the processor, no movement of the target edge fragment.

13. A computer program product comprising a non-transitory computer recordable medium having a computer readable program recorded thereon, wherein the computer readable program, when executed on a computing device, causes the computing device to:

perform an optical proximity correction on a set of target patterns provided by a designer for a predetermined number of iterations until a counter value exceeds a maximum predetermined number of iterations in order to produce a set of optical proximity correction mask shapes;

responsive to the counter value exceeding the maximum predetermined number of iterations, generate a set of lithographic contours for each of the set of optical proximity correction mask shapes;

perform a normalized image log slope (NILS) extraction on the set of target shapes and use the set of lithographic contours to produce NILS values;

responsive to the NILS values failing to be within a predetermined limit, modify at least one target shape in the set of target patterns provided by the designer based on the NILS values in order to produce a set of modified target shapes;

perform the optical proximity correction on the set of modified target shapes for the predetermined number of iterations until the counter value exceeds the maximum predetermined number of iterations in order to produce a set of modified optical proximity correction mask shapes;

responsive to the counter value exceeding the maximum predetermined number of iterations, generate a set of modified lithographic contours for each of the set of modified optical proximity correction mask shapes;

perform the normalized image log slope (NILS) extraction on the set of modified target shapes and use the set of modified lithographic contours to produce the NILS values; and repeat the modify the at least one target shape in the set of target patterns provided by the designer based on the NILS values in order to produce the set of modified target shapes, perform the optical proximity correction on the set of modified target shapes, generate the set of modified lithographic contours for each of the set of modified optical proximity correction mask shapes, and perform the normalized image log slope (NILS) extraction on the set of modified target shapes and use the set of modified lithographic contours to produce the NILS values steps until the NILS values are within the predetermined limit.

14. The computer program product of claim 13, wherein the computer readable program further causes the computing device to:

responsive to the NILS values being within the predetermined limit, generate a set of clean mask shapes.

15. The computer program product of claim 13, wherein the NILS extraction is performed on target edge fragments from the set of lithographic contours, wherein the NILS extraction computes at least one of a NILS for width (WNILS) or a NILS for space (SNILS), wherein low WNILS are indicative of potential pinching areas, and wherein low SNILS are indicative of potential bridging areas.

16. The computer program product of claim 15, wherein the computer readable program further causes the computing device to:

responsive to performing the NILS extraction on target edge fragments from the set of lithographic contours resulting in identifying a target edge fragment with low WNILS, move the target edge fragment out by a predetermined specified amount;

responsive to performing the NILS extraction on target edge fragments from the set of lithographic contours resulting in identifying a target edge fragment with low SNILS, move the target edge fragment in by a predetermined specified amount; and responsive to performing the NILS extraction on target edge fragments from the set of lithographic contours resulting in identifying a target edge fragment with low WNILS and low SNILS, perform no movement of the target edge fragment.

17. An apparatus, comprising:

a processor; and a memory coupled to the processor, wherein the memory comprises instructions which, when executed by the processor, cause the processor to:

perform an optical proximity correction on a set of target patterns provided by a designer for a predetermined number of iterations until a counter value exceeds a maximum predetermined number of iterations in order to produce a set of optical proximity correction mask shapes;

responsive to the counter value exceeding the maximum predetermined number of iterations, generate a set of lithographic contours for each of the set of optical proximity correction mask shapes;

perform a normalized image log slope (NILS) extraction on the set of target shapes and use the set of lithographic contours to produce NILS values;

responsive to the NILS values failing to be within a predetermined limit, modify at least one target shape in the set of target patterns provided by the designer based on the NILS values in order to produce a set of modified target shapes;

perform the optical proximity correction on the set of modified target shapes for the predetermined number of iterations until the counter value exceeds the maximum predetermined number of iterations in order to produce a set of modified optical proximity correction mask shapes;

responsive to the counter value exceeding the maximum predetermined number of iterations, generate a set of modified lithographic contours for each of the set of modified optical proximity correction mask shapes;

perform the normalized image log slope (NILS) extraction on the set of modified target shapes and use the set of modified lithographic contours to produce the NILS values; and repeat the modify the at least one target shape in the set of target patterns provided by the designer based on the NILS values in order to produce the set of modified target shapes, perform the optical proximity correction on the set of modified target shapes, generate the set of modified lithographic contours for each of the set of modified optical proximity correction mask shapes, and perform the normalized image log slope (NILS) extraction on the set of modified target shapes and use the set of modified lithographic contours to produce the NILS values steps until the NILS values are within the predetermined limit.

18. The apparatus of claim 17, wherein the instructions further cause the processor to:

responsive to the NILS values being within the predetermined limit, generate a set of clean mask shapes.

19. The apparatus of claim 17, wherein the NILS extraction is performed on target edge fragments from the set of lithographic contours, wherein the NILS extraction computes at least one of a NILS for width (WNILS) or a NILS for space (SNILS), wherein low WNILS are indicative of potential pinching areas, and wherein low SNILS are indicative of potential bridging areas.

20. The apparatus of claim 19, wherein the instructions further cause the processor to:
   responsive to performing the NILS extraction on target edge fragments from the set of lithographic contours resulting in identifying a target edge fragment with low WNILS, move the target edge fragment out by a predetermined specified amount;
   responsive to performing the NILS extraction on target edge fragments from the set of lithographic contours resulting in identifying a target edge fragment with low SNILS, move the target edge fragment in by a predetermined specified amount; and
   responsive to performing the NILS extraction on target edge fragments from the set of lithographic contours resulting in identifying a target edge fragment with low WNILS and low SNILS, perform no movement of the target edge fragment.

* * * * *